| United States Patent [19] | [11] Patent Number: 4,880,724 |
|---|---|
| Toyama et al. | [45] Date of Patent: Nov. 14, 1989 |

[54] METHOD FOR MANUFACTURE OF LITHOGRAPHIC PRINTING PLATE WITH DISPOSABLE DEVELOPER WITH SURFACTANT

[75] Inventors: Tadao Toyama; Hisao Ohba; Kenji Kunichika, all of Shizuoka, Japan

[73] Assignee: Fuji Photo Film Co., Ltd., Kanagawa, Japan

[21] Appl. No.: 136,952

[22] Filed: Dec. 23, 1987

[30] Foreign Application Priority Data

Dec. 23, 1986 [JP] Japan ................................ 61-307056

[51] Int. Cl.$^4$ ................................................ G03F 7/08
[52] U.S. Cl. .................................... 430/302; 430/189; 430/309; 430/331; 354/299; 354/317; 354/318
[58] Field of Search ............... 430/309, 302, 331, 189; 354/299, 317, 318

[56] References Cited

U.S. PATENT DOCUMENTS

| 3,891,439 | 6/1975 | Katz et al. ........................... 430/331 |
| 4,186,006 | 1/1980 | Kobayashi et al. .................. 430/331 |
| 4,222,656 | 9/1980 | Harrell et al. ....................... 354/317 |
| 4,259,434 | 3/1981 | Yamasue et al. .................... 430/309 |
| 4,339,530 | 7/1982 | Sprintschnik ....................... 430/309 |
| 4,374,920 | 2/1983 | Wanat et al. ........................ 430/309 |
| 4,379,830 | 4/1983 | Deutsch et al. ..................... 430/309 |
| 4,469,776 | 9/1984 | Matsumoto et al. ................ 430/309 |
| 4,606,995 | 8/1986 | Kita et al. ........................... 430/309 |
| 4,661,436 | 4/1987 | Lewis et al. ........................ 430/309 |
| 4,737,810 | 4/1988 | Kobayashi et al. ................. 354/299 |

*Primary Examiner*—Charles L. Bowers, Jr.

[57] ABSTRACT

Disclosed is a method for the manufacture of a lithographic printing plate where a photosensitive lithographic printing plate precursor is imagewise exposed, a determined about of a developer is supplied to the exposed surface and the developer is the disposed of. A surfactant is added to the developer so that the surface tension of the developer is about 50 dyne/cm or less at 25° C. By the addition of the surfactant, a stable and economical development of an exposed plate is possible with a small amount of the surfactant-containing developer.

13 Claims, No Drawings

METHOD FOR MANUFACTURE OF LITHOGRAPHIC PRINTING PLATE WITH DISPOSABLE DEVELOPER WITH SURFACTANT

FIELD OF THE INVENTION

The present invention relates to a method for processing a photosensitive lithographic printing plate precursor by development, and more particularly, to an improved process in which a predetermined amount of a fresh developer is continuously supplied for the stable development of the plate.

BACKGROUND OF THE INVENTION

It is general practice to use an automatic developing machine for developing a large amount of photosensitive lithographic printing plate precursors (hereinafter referred to as "PS plates").

The automatic developing machines typically include a device for the horizontal conveyance of PS plates, a developer tank and a spray device. The exposed PS plates are generally developed by spraying a developer, which has been supplied to a spray nozzle using a pump, upon horizontally conveyed exposed PS plates. Another type of automatic developing machine is also known where PS plates are dipped and conveyed through a developing tank, containing a developer by using a liquid guide roll or the like.

In the above processes, the developer is typically circulated through the automatic developing machine for repeated use for economical reasons. Therefore, the concentration of the light-sensitive layer components which are dissolved in the developer gradually increase thereby adversely affecting the ability of the developer to perform its function and causing a buildup of refuse or sludge in the form of precipitates in the developer. Furthermore, when an alkaline developer is used, carbon dioxide from the air may be absorbed thereby causing deterioration of the developer.

In addition to the above-mentioned problems relating to the deterioration of the developer solution, the machine itself can be stained by scattered liquid from the spray. Therefore, frequent exchange of the developer and washing of the automatic developing machine is required.

In an effort to overcome the above-described problems, a developer-replenishing system has been proposed, in Japanese Patent Application (OPI) Nos. 115039/80 and 95349/83 (the term "OPI" as used herein means a "published and unexamined Japanese patent application") for a circulation-system development of large numbers of PS plates, whereby a stabilized developer can be maintained for long periods of time. However, this system also is very complicated in that it requires careful control and maintenance of the replenishing device.

Methods for overcoming the above-mentioned problems associated with systems where large amounts of a developer are circulated and re-used in an automatic developing machine, have also been proposed in Japanese Patent Application (OPI) Nos. 29505/73 and 32044/80 and U.S. Pat. No. 4,222,656. In these methods a predetermined amount of fresh developer is supplied to the exposed surface of a PS plate. After development, the developer is then removed and disposed of (this type of systems being referred to as a "disposable development system" hereinafter).

In the disposable development system, the amount of a developer to be maintained on the PS plate for a predetermined period of time, may be kept to a minimum. Unfortunately, the developer is often uneven thereby causing development unevenness. In this regard, various attempts to overcome this problem have been made such as the use of larger amounts of the developer supplied to the PS plates, and evening the developer on the surface of the PS plates with a brush or sponge. However, the use of larger amounts of developer than the minimum amount necessary for development becomes necessary, thus unfavorably elevating the processing costs.

SUMMARY OF THE INVENTION

The object of the present invention, therefore, is to provide a method for development of PS plates, which may overcome the various problems associated with the disposable development system, and which is stable and economical for a long period of time. More specifically, the object of the present invention is to provide a method for development of PS plates which is capable of consistently obtaining a uniform finish while using only small amounts of developer. Another object of the present invention is to provide an automatic developing machine which supplies and maintains small but even amounts of developer to the surface of a PS plate, and which requires little maintenance.

Briefly, the present inventors have found that the above objects can be obtained by lowering the surface tension of the developer to not more than a certain value in the disposable development system. Specifically, the present invention relates to a method for manufacturing a lithographic printing plate wherein (i) a photosensitive lithographic printing plate precursor is imagewise exposed, (ii) a predetermined amount of a developer is supplied to the exposed surface thereof and (iii) thereafter the developer is disposed of. In the above-described method a surfactant is added to the developer to obtain a surface tension of the developer of 50 dyne/cm or less at 25° C.

DETAILED DESCRIPTION OF THE INVENTION

In accordance with the present invention, even a small amount of a developer can be evenly maintained on the surface of a PS plate in the disposable development system. Therefore, development can be effected by the use of an extremely small amount of developer, or for that matter, by only that minimum amount necessary, with no development unevenness.

Moreover, the present invention provides a method wherein after having been uniformly supplied to the surface of a PS plate, the developer may be maintained evenly on the surface of the plate without requiring the use of a complicated device, but with a relatively simple device. Therefore, sustained or complex maintenance of the automatic developing machine it not necessary. In addition, stable development conditions can be maintained even when the automatic developing machine is used for a long period of time.

PS plates which are suitable for use in the method of the present invention are not specifically limitative. Typical examples of suitable PS plates include those PS plates formed by providing a light-sensitive layer of a mixture comprising a diazo-resin (a salt of p-diazo-phenylamine/paraformaldehyde condensation product) and a shellac or an aluminium base such as those disclosed in British Pat. No. 1,350,521; negative PS plates formed by providing a light-sensitive layer of a mixture comprising a diazo-resin and a polymer, which contains a hydroxyethyl methacrylate unit or hydroxyethyl acrylate unit as the main repeating unit, on an aluminium base, or positive PS plates formed by providing a light-sensitive layer of an o-quinone-diazide compound on an alminium base, such as those disclosed in British Pat. Nos. 1,460,978 and 1,505,739; and the negative PS plates which have a light-sensitive layer comprising an o-quinone-diazide compound as the main component and which, after having been imagewise exposed, are heated and wholly exposed and developed to obtain the negative effect, such as those disclosed in Japanese Patent Publication No. 14970/81.

However, the lithographic plate-manufacturing method of the present invention is particularly effective for the manufacture of a lithographic printing plate from the PS plates which have a light-sensitive layer comprising an o-quinone-diazide compound as the main component. Accordingly, the present invention will be explained in more detail hereinafter, with respect to o-quinone-diazide type PS plates.

Although the developer for use in the present invention is not particularly limited so long as the developer being alkaline, in view of the processing time considerations and the ability to achieve complete dissolution at the exposed parts, it is preferred that the developer have a pH value of about 10.5 or more at 25° C.

Examples of suitable alkaline agents, include inorganic alkaline agents, such as sodium silicate, potassium silicate, ammonium silicate, sodium hydroxide, lithium hydroxide, potassium hydroxide, sodium tertiary phosphate, sodium secondary phosphate, potassium tertiary phosphate, potassium secondary phosphate, ammonium tertiary phosphate, ammonium secondary phosphate, sodium meta-silicate, sodium bicarbonate, sodium carbonate potassium carbonate, ammonium carbonate,; organic alkaline agents, such as mono-, di- or triethanolamine and tetraalkylammonia hydroxide,; and organic ammonium silicates.

Among the above-mentioned alkaline agents, silicates are the most preferred. In this regard, the amount of the silicate to be used is generally from about 0.5 to about 10% by weight, preferably from 1 to 8% by weight, and more preferably from 1 to 6% by weight, based on the total amount of the developer.

The ratio of silicate to be used is represented by $SiO_2/M_2O$ ( in which M represents an alkali metal). In this regard, with smaller values of the ratio more rapid development will be obtained. With the plate-manufacturing method of the present invention, when no development-acceleration operation, such as rubbing with a brush or sponge, is used, or when just a simple development is effected, the molar ratio in the silicate to be used is preferably 1.2 or less.

The surface tension of the developer is preferably 50 dyne/cm or less and more preferably 40 dyne/cm or less, at 25° C. In particular, a surface tension of 35 dyne/cm or less is the most preferred since the amount of the developer which is necessary may be reduced substantially.

Generally, any surfactant or mixture of surfactants may be added to the developer in accordance with the present invention provided that it is effective for making the surface tension of the developer 50 dyne/cm or less at 25° C. However, one which sufficiently lowers the surface tension of the developer, even if it is provided in a relatively small amount, while not having an adverse influence on the developability of the developer, is preferred. In this regard, it should be noted that previously a technique of adding an anionic or ampholytic surfactant, such as sodium alkylnaphthalenesulfonates, N-tetradecyl-N,N-dihydroxyethylbetaine, etc., as disclosed in Japanese Patent Application (OPI) No. 51324/85, or a non-ionic surfactant, such as tetramethyldecyne-diol, etc., as disclosed in U.S. Pat. No. 4,374,920, to the developer for the o-quinone-diazide type light-sensitive layer-containing PS plate, has been used to protect the image while preventing overdevelopment. However, if such surfactant is added to a developer until the surface tension of the developer becomes 50 dyne/cm or less, the developability would be unfavorably decreased in a conventional development system in which the developer is circulated for repeated use.

In the method of the present invention, although some anionic surfactants, such as sodium alkyldiphenyletherdisulfonates and sodium alkylsulfonates, can be used, preferred surfactants for the present invention are fluorine-series surfactants having a perfluoroalkyl group in the molecule. Such fluorine-series surfactants include, for example, anionic surfactants such as perfluoroalkylcarboxylic acid salts, perfluooralkyl-sulfonic acid salts, perfluoroalkyl-phosphoric acid esters; amphoteric surfactants such as perfluoroalkylbetaines; cationic surfactants such as perfluoroalkyl-trimethylammonium salts; and nonionic surfactants such as perfluoroalkylamine-oxides, perfluoroalkylethyleneoxide adducts, oligomers containing a perfluoroalkyl group and a hydrophilic group, oligomers containing a perfluoroalkyl group and an oleophilic group, oligomers containing a perfluoroalkyl group, a hydrophilic group and an olephilic group, urethanes containing a perfluoroalkyl group and an olephilic group.

The preferred amount of the surfactant to be added to the developer is that which is necessary for lowering the surface tension of the developer to 50 dyne/cm or less. Generally, this amount is from about 0.001 to about 3% by weight, and preferably from about 0.003 to about 0.5% by weight, based on the total amount of the developer.

The developer is generally supplied in the form of a concentrated solution, which is then diluted to a desired dilution proportion by the lithographic plate-maker during actual use. The surfactant may be added to the concentrated developer solution prior to dilution or upon dilution of the developer.

Other various types of surfactants, such as those as described in the above-mentioned Japanese Patent Application (OPI) No. 51324/85 and U.S. Pat. No. 4,374,920 can be further added to the developer for use in the method of the present invention. In addition, other additives such as those mentioned below, can be added to the developer of the present invention, so as to further increase the developability thereof. Suitable additives include neutral salts such as NaCl, KCl, KBr, etc., as described in Japanese Patent Application (OPI) No. 75152/83; chelating agents such as EDTA, NTA, etc., as described in Japanese Patent Application (OPI) No. 190952/83; complexes such as $[CO(NH_3)_6]Cl_3$, $COCl_2.6H_2O$, etc., as described in Japanese Patent Application (OPI) No. 121336/84; cationic polymers such as p-dimethylaminomethyl polystyrene methyl-chloride quaternary compounds, etc., as described in Japanese Patent Application (OPI) No. 95946/80; amphoteric high molecular electrolytes such as vinylbenzyltrimethylammonium chloride/sodium acrylate copolymers, etc., as described in Japanese Patent Application (OPI) No. 142528/81; reducing inorganic salts such as sodium sulfite, etc., as described in Japanese Patent Application (OPI) ,No. 192952/82; inorganic lithium compounds such as lithium chloride, etc., as described in Japanese Patent Application (OPI) No. 59444/83; organic lithium compounds such as lithium benzoate, etc., as described in Japanese Patent Publication No. 34442/75; organic metal surfactants including Si, Ti, etc., as described in Japanese Patent Application (OPI) No. 75255/84; organic boron compounds such as those described in Japanese Patent Application (OPI) No. 84241/84; quaternary ammonium salts such as tetraalkylammonium-oxides, etc.; and organic solvents such as benzyl alcohol, ethylene glycol-monophenylether, etc., as described in European Pat. No. 101,010, etc.

The PS plates to which the lithographic plate-manufacturing method of the present invention can preferably be applied are those formed by providing a light-sensitive layer comprising an o-quinone-diazide compound, more preferably an o-naphthoquinone-diazide compound, on a support. Suitable supports include metal plates such as those made from aluminium (including aluminium alloys), zinc, lead, copper, iron etc., and composite plates which include those metals; plastic films or sheets such as those formed from cellulose diacetate, cellulose triacetate, cellulose propionate, cellulose butyrate, cellulose acetate-butyrate, cellulose nitrate, polyethylene terephthalate, polyethylene, polypropylene, polystyrene, polycarbonate, polyvinyl alcohol, etc.; paper or plastic films on which any of the above-mentioned metals have been plated by evaporation plating or laminated; and composite sheets formed by bonding an aluminium sheets onto a polyethylene terephthalate film, etc. Among these, supports having an aluminium surface are preferred due to their dimensional stability.

The surface of the support is generally processed for the purpose of imparting a hydrophilicity thereto or for preventing any harmful reaction with the light-sensitive layer to be provided on the surface. This improves the adhesiveness of the surface to the light-sensitive layer. For example, a support having an aluminium surface is preferably polished by mechanical, chemical or electrical treatment and then dipped in an aqueous solution containing sodium silicate, potassium fluoro-zirconate, a phosphate, etc., or subjected to anodic oxidation treatment. The anodic oxidation can be effected, for example, by electrolyzing the aluminium-coated support as the anode in an electrolytic solution of an aqueous solution containing an inorganic salt such as sulfuric acid, chromic acid, phosphoric acid, boric acid, etc., or an organic acid such as oxalic acid, sulfamic acid, etc., singly or in mixtures. In addition, the silicate electrodeposition described in U.S. Pat. No. 3,658,622 is also effective.

Examples of supports of this type include the aluminium plate which as been grained and then dipped in a sodium silicate solution as described in U.S. Pat. No. 2,714,066; the aluminium plate, which has been subjected to anodic oxidation and then dipped in an alkali metal silicate solution as described in Japanese Patent Publication No. 5125/72; the supports which have been subjected to electrolytic graining and then to anodic oxidation treatment as described in Japanese Patent Publication No. 27481/71 and Japanese Patent Application (OPI) Nos. 58602/77 and 30503/77, etc.

Of the light-sensitive layer which may be provided on the support, an o-naphthoquinone-diazide compound is especially effective for the method of the present invention. Specific examples of such compounds are provided in various publications such as U.S. Pat. Nos. 3,046,110, 3,046,111, 3,046,112, 3,046,115, 3,046,118, 3,046,119, 3,046,120, 3,046,121, 3,046,122, 3,046,123, 3,061,430, 3,162,809, 3,106,465, 3,635,709 and 3,647,443. Of these, o-naphthoquinone-diazide-sulfonic acid esters or o-naphthoquinone-diazide-carboxylic acid esters of aromatic hydroxy compounds, as well as o-naphthoquinone-diazide-sulfonic acid amides or o-naphthoquinone-diazide-carboxylic acid amide of aromatic amine compounds, are especially preferred. More particularly, the compounds obtained by esterifying a pyrogallol-/acetone condensation product and an o-naphthoquinone-diazidesulfonic acid, as described in U.S. Pat. No. 3,635,709; the compounds obtained by esterifying a polyester having a terminal hydroxyl group and an o-naphthoquinone-diazidesulfonic acid or o-naphthoquinone-diazidecarboxylic acid, as described in U.S. Pat. No. 4,028,111; and the compounds obtained by esterifying a homopolymer of p-hydroxystyrene or a copolymer of p-hydroxystyrene and a copolymerizable monomer and an o-naphthoquinone-diazidesulfonic acid or o-naphthoquinone-diazide-carboxylic acid, as described in British Pat. No. 1,494,043 are particularly excellent examples of suitable compounds.

Although the o-naphthoquinone-diazide compounds can be used singly, they are preferably used together with an alkali-soluble resin. Preferred resins include novolak-type phenol resins such as phenol-formaldehyde resins, o-cresol-formaldehyde resins, and m-cresol-formaldehyde resins. Furthermore, the combined use of the phenol resin described in Japanese Patent Application (OPI) No. 125806/75 and a condensation product of a phenol or cresol which is substituted by an alkyl group having from 3 to 8 carbon atoms and a formaldehyde, such as a 1-butylphenolformaldehyde resin, is more preferred. The amount of the alkali-soluble resin to be used ranges from about 50to about 85% by weight, preferably from 60 to 80% by weight, based on the total weight of the light-sensitive layer of the PS-plate.

The light-sensitive layer may further contain, if desired, a dye, a plasticizer, a component for imparting the printing-out property to the layer, etc. As these additives, any known materials can be used. In this regard, alcohol-soluble dyes, such as C.I. 26, 105 (oil Red RR), C.I. 21, 260 (Oil Scarlet No. 308), C.I. 74, 350 (Oil Blue), C.I. 52, 015 (Methylene Glue), C.I. 42, 555 (Crystal Violet), etc., are preferred dyes. These dyes have an effect of displaying a sufficient contrast between the image part and the non-image part in an exposed and developed PS plate. The amount of the dye to be used is generally about 7% by weight or less, based on the total weight of the light-sensitive composition.

Examples of plasticizer which may be effectively used include phthalic acid esters such as dimethyl phthalate, diethyl phthalate, dibutyl phthalate, diisobutyl phthalate, dioctyl phthalate, octylcapryl phthalate, dicyclohexyl phthalate, ditridecyl phthalate, butylbenzyl phthalate, diisodecyl phthalate, diallyl phthalate, etc.; glycol esters such as dimethylglycol phthalate, ethylphthalylethyl glycolate, methylphthalylethyl glycolate, butylphthalylbutyl glycolate, triethylene glycol dicaprilate, etc.; phosphoric acid esters such as tricresyl phosphate, triphenyl phosphate, etc.; aliphatic dibasic acid esters such as diisobutyl adipate, dioctyl adipate, dimethyl sebacate, dibutyl sebacate, dioctyl azelate, dibutyl maleate, etc.; and polyglycidyl methacrylate, triethyl citrate, glycerin triacetylester, butyl laurate, etc. The amount of the plasticizer to be used is generally about 5% by weight or less, based on the total amount of the light-sensitive composition.

The printing-out component should be added to the light-sensitive layer so that when the light-sensitive layer of the PS plate has been imagewise exposed, the formed image can be directly observed in the form of a visible image. There may be mentioned the pH indicators such as those described in British Pat. No. 1,041,463; the combination of an o-naphthoquinone-diazide-4-sulfonyl chloride and a dye as described in U.S. Pat. No. 3,969,118; and photocromic compounds as described in Japanese Patent Publication No. 6413/69. In addition, an acid anhydride block can be added to the light-sensitive layer so as to improve the sensitivity of the layer. An example of this is described in Japanese Patent Application (OPI) No. 80022/77.

The above-mentioned light-sensitive composition can be formed into a solution by using a suitable solvent, and the resulting solution can be coated on a support to form the light-sensitive layer on the support. Examples of suitable solvents include glycolethers such as ethylene glycol-monomethylether, ethylene glycolmonoethylether, 2-methoxyethyl acetate, etc.; ketones such as acetone, methylethylketone, cyclohexanone, etc.; and chlorinated hydrocarbons such as ethylene dichloride, etc. The amount of the light-sensitive composition to be coated on the support ranges from about 0.5 to about 7 $g/m^2$, preferably from 1.0 to 3 $g/m^2$.

The thus-prepared positive-working PS plate is exposed to a light ray having a suitable active ray such as that produced by a carbon-arc lamp, a mercury lamp, a metal halide lamp, a xenone lamp, or a tungsten lamp. The plate is exposed through a transparent original whereby the exposed part becomes alkaline-soluble and, therefore, can be dissolved out with a developer or an alkaline solution.

To supply the developer to the exposed PS plate in the disposable development system of the present invention, a variety of methods can be utilized. For example, jetting, spraying or the dropwise application of the developer solution to the surface of the plate by the use of a shower pipe or nozzle can be used; or the developer solution can be coated over the surface of the plate by using a developer supply device which is either in contact or not in contact with the surface of the plate.

Regarding the means for supplying the developer to the surface of the PS plate by contacting the PS plate with the developer supply device, examples include a method wherein the developer is applied to the PS plate by rubbing the surface thereof with a water-absorbable part such as a sponge or cloth, a method wherein the developer is applied to the PS plate with a roller part made of either a non-water-absorbable part such as a rubber or a water-absorbable part such as the above-mentioned sponge or cloth, whereupon the speed of the conveyance of the PS plate is synchronized with the rotation of the roller, and a method wherein the developer is quantitatively applied to the PS plate with a wire bar.

Regarding the means for supplying the developer to the surface of the PS plate wherein the plate is not contacted with the developer supply device, examples include a method wherein the developer is applied to the PS plate by passing the PS plate through a thin space containing the developer, a method wherein the PS plate is contacted with the developer which is dropped onto the surface of the PS plate from a developer supply device by the action of the surface tension of the developer, and a method wherein the developer is stored in a cylindrical container having a thin slit at the side surface thereof and the PS plate is passed through the thin slit so that the developer in the container may be applied to the surface of the PS plate.

Among the above-mentioned developer supply means, the method using a wire bar is the most preferred since the supply amount of the developer may be mentioned constant. This allows for the constant control of the amount of developer to be applied to the unit area of the PS plate irrespective of the size of the said PS plate. Also, the structure of the wire bar device is simple so that the maintenance thereof is easy.

The amount of the developer to be supplied by the supply means ranges from about 30 to about 500 ml, preferably from about 50 to about 200 ml, per $m^2$ of the PS plate.

After the developer is applied to the surface of the PS plate, it is maintained thereon for a predetermined period of time, and then scrapped from the surface of the PS plate and disposed of.

The thus-developed PS plate may then be subjected to conventional PS processing procedure, including water-rinsing, retouching, gum-coating, etc., to give a completed lithographic printing plate.

In the interest of brevity and conciseness, the contents of the numerous patents and publications mentioned herein are hereby incorporated by reference.

The following examples are intended to illustrate the present invention but are not intended to limit it in any way.

EXAMPLES 1 TO 6 COMPARATIVE EXAMPLE 1

A grained 2S-aluminium plate was etched by dipping in a 2 wt.% sodium hydroxide solution kept at 40° C. for one minute. Next, after the plate was rinsed with water, it was dipped in a mixed solution of sulfuric acid/chromic acid for about one minute thereby to expose the pure aluminium surface thereto. The plate was then dipped in a 20 wt.% sulfuric acid solution kept at 30° C., whereupon anodic oxidation treatment was effected under the condition of direct voltage of 1.5V and a current density of 2 $A/dm^2$ for 2 minutes. The plate was then rinsed with water and dried. On the thus-processed aluminium plate was coated the light-sensitive solution having the composition as mentioned below, in an amount (dry weight) of 2 $g/m^2$, and the layer was dried to obtain a PS plate.

Light-Sensitive Composition:

| | |
|---|---|
| Naphthoquinone-1,2-diazide(2)-5-sulfonic acid ester of acetone-pyrogallol resin (produced by the method described in Example 1 of U.S. Pat. No. 3,635,709) | 5 g |
| T-butylphenol-formaldehyde resin (PR-50530, manufactured by Sumitomo Dures Co.) | 0.5 g |
| Cresol-formaldehyde resin (Hitanol No. 3110, manufactured by Hitachi Chemical Co.) | 5 g |
| Methylethylketone | 50 g |

-continued

| | |
|---|---|
| Cyclohexanone | 40 g |

The PS plate was exposed to a light with a 3 KW metal halide pump (having a Toshiba Metal Halide Lamp MU2000-2-OL type light source and using Plano PS Light sold by Fuji Photo Film Co., Ltd.) with a distance of 1 m between the lamp the plate, through a transparent positive film for 30 seconds in a vacuum container. Next, the developer having the composition as shown in Table 1 below was prepared.

The thus-prepared PS plate was developed with the said developer in a disposable type automatic developing machine having a wire bar as the developer supply device and a squeeze roller as the developer-scraping device. The disposable type automatic developing machine of this kind is described in detail in Japanese Patent Application (OPI) No. 59958/87. The amount of the developer used was 120 ml per $m^2$ of the PS plate. After the developer was supplied to the surface of the PS plates which were being conveyed horizontally, with a wire bar, the developer was scraped off when the plate reached the squeeze roller in 15 minutes, without the PS plate being rubbed with a brush or sponge. The results obtained after the development are shown in Table 1 below.

lack of the developer, and the light-sensitive layer part to be developed could not be completely removed.

In the case of the Examples 1 to 6 where the developer of the present, invention was used, the developer supplied to the plates could be evenly maintained on the surface of the PS plates which were being conveyed horizontally, whereby the desired lithographic printing plates with no development unevenness could be obtained.

After being washed with water the developed lithographic printing plate was gummed up and then set on a printing machine and used for actual printing. As a result, the lithographic printing plate of the Comparative Example 1 produced prints having stains in the portion corresponding to the insufficiently developed part in the plate, while the lithographic printing plates of the Examples 1 to 6 continuously produced beautiful prints from several sheets from the beginning of the printing operation.

EXAMPLE 7

The same process as the Example 3 was repeated except that the amount of the developer supplied was varied. The results show that development could be effected uniformly even when the mount of the developer was reduced to 70 ml per $m^2$ of the plate.

TABLE 1

| Composition of Developer and Developability with the Developer | Comparative Example 1 | Example 1 | Example 2 | Example 3 | Example 4 | Amount Added: g Example 5 | Example 6 |
|---|---|---|---|---|---|---|---|
| Water | 950 | 950 | 950 | 950 | 950 | 950 | 950 |
| Sodium Silicate ($SiO_2/Na_2O = 1/1$, by mole, 40% aqueous solution) | 50 | 50 | 50 | 50 | 50 | 50 | 50 |
| 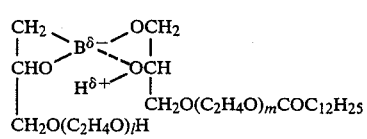 $l + m = 40$ | 0.2 | 0.2 | 0.2 | 0.2 | 0.2 | 0.2 | 0.2 |
| 40 wt. % Aqueous Solution of Sodium Dodecyldiphenylether-disulfonate | — | 0.5 | — | — | — | — | — |
| 30% Water/isopropanol Solution of Perfluoroalkylbetaine Amphoteric Surfactant (Trade name, Surflon S-131, by Asahi Glass Co.) | — | — | 0.1 | 0.5 | — | — | — |
| Potassium Perfluoroalkylsulfonate (Trade name, Megafac F-110, by Dainippon Ink Co.) | — | — | — | — | 0.2 | — | — |
| Oligomer containing Perfluoroalkyl group, Oleophilic group and Hydrophilic group (Trade name, Megafac F-177, by Dainippon Ink Co.) | — | — | — | — | — | 0.2 | — |
| Perfluoroalkyl-ED Adduct (Trade Name, Megafac F-142D, by Dainippon Ink Co.) | — | — | — | — | — | — | 0.2 |
| Surface Tension (dyne/cm) | 65 | 32 | 28.5 | 23 | 30 | 28 | 27 |
| Retentiveness of Developer on PS Plate | X | O | O | O | O | O | O |
| Uniformity after Development | X | O | O | O | O | O | O |

"X" represents bad result in retentiveness or uniformity.
"O" represents good result in retentiveness or uniformity.

In Comparative Example 1 a conventional developer was used. The developer as supplied to the surface of the PS plate with the wire bar was concentrated at several portions immediately after the supply thereof. As a result, although the portions at which the developer had been concentrated were developed, the other portions were insufficiently developed because of the

COMPARATIVE EXAMPLE 2

The same process as the Comparative Example 1 was repeated except that the amount of the developer supplied was increased. A developable amount of the developer could be maintained on the complete surface of the PS plate only when the amount of the developer supplied was increased up to 450 ml per m² of the plate. Accordingly, the whole surface of the plate could be developed, but the plate was partly over-developed thereby causing a noticeable development unevenness.

EXAMPLE 8

The process of the Example 3 was repeated for about one month, wherein 20 sheets of PS plates having a size of 1003 mm ×800 mm were processed a day. In this continuous procedure, since fresh developer was always used, development could be effected uniformly and uniformly finished lithographic plates were obtained.

EXAMPLES 9 TO 12

The same process as the Example 3 was repeated except that a developer with a molar ratio of $SiO_2/Na_2O$ being 0.9, 1.2, 1.4 or 1.6, which had been prepared by varying only the amount of $Na_2O$ without changing the concentration of the $SiO_2$ in the sodium silicate, was used. In this procedure, the conveyance speed of the automatic developing machine was varied and the optimum time required for development was checked. The results shown in Table 2 below were obtained, which indicate that the rapid development was possible even with a developer having a molar ratio of 1.2 or less.

TABLE 2

Molar Ratio of $SiO_2/Na_2O$ and Optimum Development Time

| | Example 9 | Example 3 | Example 10 | Example 11 | Example 12 |
|---|---|---|---|---|---|
| Molar Ratio of $SiO_2/Na_2O$ | 0.9 | 1.1 | 1.2 | 1.4 | 1.6 |
| Optimum Development Time | 10 sec. | 10 sec | 15 sec | 20 sec | 25 sec |

While the invention has been described in detail and with reference to specific embodiments thereof, it will be apparent to one skilled in the art that various changes and modification can be made therein without departing from the spirit and scope thereof.

What is claimed is:

1. A method of preparing a lithographic printing plate utilizing a disposable development system which comprises the steps of, in order,
   (a) imagewise exposing to an actinic light a photosensitive lithographic printing plate precursor comprising a support having a light-sensitive layer containing an o-quinone diazide compound and a alkali-soluble resin;
   (b) supplying to the imagewise exposed surface of the precursor a predetermined amount of a developer comprising an alkaline aqueous solution containing from about 0.5 to about 10% by weight of an alkali metal silicate and a surfactant in an amount sufficient to have a surface tension of the developer of 50 dyne/cm or less at 25° C. and a pH of a least 10.5 to 25° C.;
   (c) maintaining an amount of the developed supplied in step (b) on the precursor for a predetermined period of time to develop the light-sensitive layer;
   (d) removing the developer on the precursor from the surface thereof and
   (e) disposing of the developer such that the developer is not circulated for repeated use.

2. A method for manufacturing a lithographic printing plates as set forth in claim 1, wherein the developer contains, as the main component, a silicate salt with a molar ratio, $SiO_2/M_2O$, of about 1.2 or less, wherein M represents an alkali metal.

3. A method for manufacturing a lithographic printing plate as set forth in claim 1, wherein the alkaline aqueous developer contains from about 1 to about 1 to about 6% by weight of a silicate, based on the total amount of developer.

4. A method for manufacturing a lithographic printing plates as set forth in claim 1, wherein the surface tension of the developer is not more than about 35 dyne/cm at 25° C.

5. A method for manufacturing a lithographic printing plate as set forth in claim 1, wherein said developer contains a surfactant comprising a perfluoroalkyl group.

6. A method for manufacturing a lithographic printing plates as set forth in claim 1, wherein said developer contains from about 0.001 to about 3% by weight of said at least one surfactant, based on the total amount of developer.

7. A method for manufacturing a a lithographic printing plate as set forth in claim 6, wherein said developer contains from about 0.003 to about 0.5% by weight of said at least one surfactant, based on the total amount of developer.

8. A method for manufacturing a lithographic printing plate as set forth in claim 7, wherein the developer contains at least one additive selected from the group consisting of neutral salts, chelating agents, complexes, cationic polymers, amphoteric high molecular electrolytes, reducing inorganic salts, inorganic lithium compounds, organic lithium compounds, organic metal surfactants, organic boron compounds, quaternary ammonium salts and organic solvents.

9. A method for manufacturing a a lithographic printing plate as set forth in claim 1, wherein said light-sensitive layer is provided on a support having an aluminum surface.

10. A method for manufacturing a a lithographic printing plate as set forth in claim 1, wherein said light-sensitive layer further comprises at least one of a dye, a plasticizer and a component for imparting printing-out.

11. A method of preparing a lithographic printing plate as set forth in claim 1, wherein the predetermined amount of developer in step (b) is supplied by means of a wire bar.

12. A method for manufacturing a lithographic printing plate as set forth in claim 1, wherein the developer is supplied in an amount of about 50 to about 200 ml/m₂ of the photosensitive plate.

13. A method of preparing a lithographic printing plate as set forth in claim 1, wherein the predetermined amount of developer in the step (b) is supplied by one method selected from the group consisting of:
   (i) a method wherein the developer is applied to the precursor by rubbing the surface thereof with a water-absorbable part,
   (ii) a method wherein the developer is applied to the precursor with a roller rotating synchronized with a speed of conveyance of the plate.
   (iii) a method wherein the developer is applied to the precursor with a wire bar,
   (iv) a method wherein the developer is applied to the precursor by passing the precursor through a thin space containing the developer,
   (v) a method wherein the precursor is contacted with the developer which is dropped onto the surface of the precursor from a developer supply device by the action of the surface tension of the developer, and (vi) a method wherein the developer is stored in a cylindrical container having a thin slit at the side surface thereof and the precursor is passed through the thin slit so that the developer in the container may be applied to the surface of the precursor.

* * * * *